United States Patent [19]

Salbreux

[11] Patent Number: 5,569,609
[45] Date of Patent: Oct. 29, 1996

[54] BIDIRECTIONAL SHOCKLEY DIODE

[75] Inventor: Jean-Claude Salbreux, Saint Cyr sur Loire, France

[73] Assignee: SGS-Thomson Microelectronics S.A., Saint Genis, France

[21] Appl. No.: 465,228

[22] Filed: Jun. 5, 1995

Related U.S. Application Data

[62] Division of Ser. No. 298,074, Aug. 30, 1994.

[30] Foreign Application Priority Data

Sep. 7, 1993 [FR] France ................. 93 10883

[51] Int. Cl.⁶ ............................................... H01L 21/66
[52] U.S. Cl. ........................................... 437/8; 437/6; 437/7
[58] Field of Search ..................... 437/6, 7, 8; 257/110

[56] References Cited

U.S. PATENT DOCUMENTS

| | | |
|---|---|---|
| 3,476,993 | 11/1969 | Aldrich et al. . |
| 3,814,639 | 6/1974 | Dumas ................. 437/6 |
| 4,066,483 | 1/1978 | D'Altroy et al. ....... 437/6 |
| 4,380,114 | 4/1983 | Webb .................. 437/6 |
| 4,607,273 | 8/1986 | Sakurada et al. ....... 437/6 |
| 4,639,276 | 1/1987 | Nakagawa ............. 437/6 |
| 4,868,703 | 9/1989 | Borkowicz . |
| 5,171,696 | 12/1992 | Hagino ............... 437/6 |
| 5,352,905 | 10/1994 | Ohta ................ 257/110 |
| 5,429,953 | 7/1995 | Byatt ................. 437/6 |

FOREIGN PATENT DOCUMENTS

| | | | |
|---|---|---|---|
| 0537843 | 4/1993 | European Pat. Off. . | |
| 53-124988 | 10/1978 | Japan ............... 257/110 |
| 60-21570 | 2/1985 | Japan ............... 437/6 |
| 3-155674 | 7/1991 | Japan ............... 437/6 |
| 3-155675 | 7/1991 | Japan ............... 437/6 |
| 4-17369 | 1/1992 | Japan ............... 257/110 |

OTHER PUBLICATIONS

French Search Report from French Patent Application No. 93 10883, filed Sep. 7, 1993.
Patent Abstracts of Japan, vol. 2, No., 156(E–81), Dec. 26, 1978.

*Primary Examiner*—Kevin M. Picardat
*Attorney, Agent, or Firm*—David M. Driscoll; James H. Morris; Brett N. Dorny

[57] ABSTRACT

A bidirectional Shockley diode includes an N-type layer sandwiched between two P-type layers. A first N-type region in the P-type region extends over substantially one half of the upper surface. A second N-type region extends in the P-type layer substantially over one complementary half of the surface of the lower surface. Each first and second region protrudes with respect to the median plane of the component by a length r such that ratio r/e is smaller than 0.5, e being the thickness of the component.

2 Claims, 3 Drawing Sheets

5,569,609

BIDIRECTIONAL SHOCKLEY DIODE

This application is a division of application Ser. No. 08/298,074, filed Aug. 30, 1994, entitled BIDIRECTIONAL SHOCKLEY DIODE and now pending.

BACKGROUND OF THE INVENTION

1. Field of the Invention

The present invention relates to protection components and more particularly to bidirectional protection components, that is, components capable of absorbing negative overcharges as well as positive overcharges, such as a bidirectional Shockley diode or gateless triac.

2. Discussion of the Related Art

Such components exhibit the same breakover voltage VBO in each polarity. When the voltage between their terminals exceeds this breakover voltage, the components become conductive and exhibit at their terminals a very low voltage drop. Then, they remain conductive as long as the current flowing therethrough remains higher than a hold current value IH.

Another major characteristic of these components is the power or the maximum current they can withstand during an overcharge. It is known that this current depends upon the component's surface.

SUMMARY OF THE INVENTION

An object of the present invention is to allow an increase in the maximum current IPP that can be withstood by a bidirectional Shockley diode for a determined surface of this Shockley diode.

To achieve this object, the present invention provides a protection component of the bidirectional Shockley diode-type including a layer of a first conductivity type sandwiched between two layers of the second conductivity type, a first region of the first conductivity type formed from the upper surface of the substrate in the layer of the second conductivity type and extending over substantially one half of this upper surface, and a second region of the first conductivity type formed from the lower surface of the substrate in the layer of the second conductivity type and extending substantially over one complementary half of the surface of this lower surface. Each first and second region protrudes with respect to the median plane of the component by a length r such that r/e is smaller than 0.5, e being the thickness of the component.

According to an embodiment of the invention, r/e is between 0.1 and 0.3.

According to an embodiment of the invention, r/e is close to 0.2.

According to an embodiment of the invention, the first conductivity type is N-type.

According to an embodiment of the invention, the component is of the mesa-type.

According to an embodiment of the invention, the component is of the planar-type.

The present invention advantageously increases the maximum current that can be withstood by a protection device of the bidirectional Shockley diode type, having a determined size, without having to modify the component manufacturing characteristics but by modifying only the pattern of the emitter diffusion mask.

The foregoing and other objects, features, aspects and advantages of the invention will become apparent from the following detailed description of the present invention when taken in conjunction with the accompanying drawings.

As is conventional in integrated circuit representations, the various drawings representing cross-sectional views and top views of the components (except FIG. 6) are schematic and are not drawn to scale. More particularly, the edges of the diffused regions are schematically represented without taking into account that they are rounded up following diffusion steps.

DETAILED DESCRIPTION

Figure 1:
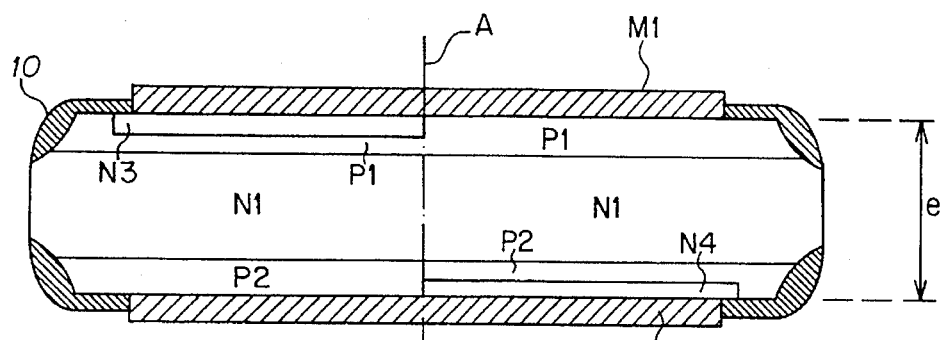
FIG. 1 is a cross-sectional view of a bidirectional Shockley diode of the mesa-type according to the prior art.

FIG. 1 is a schematic cross-sectional view of a conventional bidirectional Shockley diode. The Shockley diode includes an N-type substrate N1 in the upper and lower surfaces of which are formed a P-type diffused layer, P1, P2. In each P-type layer P1, P2, an N-type region, N3, N4, usually referred as an emitter region, is formed from the upper surface and lower surface of the component. Conventionally, as represented in FIG. 1, each N-type region N3, N4 occupies substantially one half of the surface of the component and each region does not project over the other. The N-type regions are symmetrically disposed with respect to a median plane A. The upper and lower surfaces of the component are coated with metallizations M1, M2. In the structure represented in FIG. 1, the component is of the mesa-type, that is, its periphery is grooved and coated with a passivation layer 10, usually a glassivation. Generally layer 10 extends partially over the upper surface of the component up to the periphery of regions N3 and N4. Accordingly, metallizations M1 and M2 do not contact the surfaces of regions P1 and P2 extending in the peripheral portion of regions N3 and N4.

So, there is provided, on both sides of the median plane A, a first unidirectional Shockley diode constituted by the regions N3, P1, N1, and P2 and a second unidirectional Shockley diode constituted by the regions P1, N1, P2, and N4. These Shockley diodes are strictly identical and are used to absorb negative and positive overcharges, respectively, between metallizations M1 and M2.

As indicated above, one of the major features of a protection component is the maximum current IPP that it can withstand.

Figure 2:
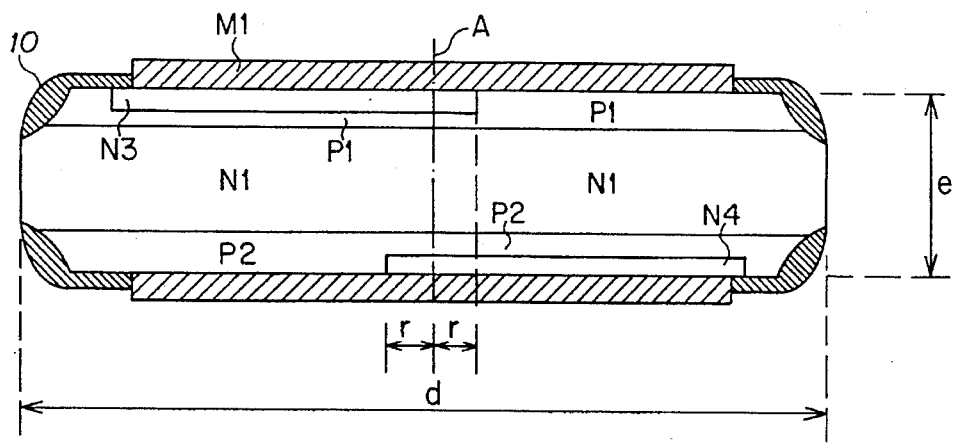
FIG. 2 is a cross-sectional view of a bidirectional Shockley diode of the mesa-type according to the present invention.

To increase this current, the present invention modifies the structure of FIG. 1 in the manner indicated in FIG. 2.

FIG. 2 shows a structure identical to the structure of FIG. 1 except for the N-type regions N3, N4 which have a determined overlapping region. Each N-type region N3, N4 extends beyond the median plane A a distance r. Thus, regions N3 and N4 exhibit an overlapping length of 2r. Since the doping levels and other operating characteristics remain unchanged, the basic breakdown voltage parameters are not modified. However, the applicant has noticed that the provision of this partial overlapping of layers N3 and N4 causes an increase in the peak current value IPP that can be withstood by the component.

Figure 3:
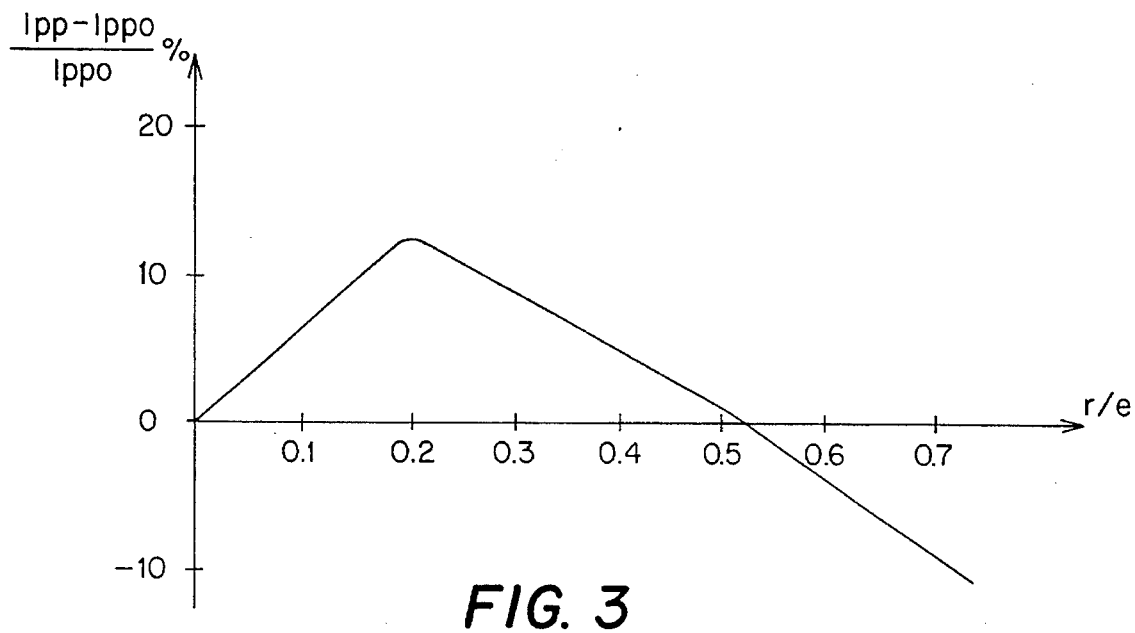
FIG. 3 is a curve illustrating the advantages obtained with the present invention.

This characteristic is illustrated in FIG. 3 where the abscissa corresponds to the ratio r/e, where e is the component thickness. More particularly, e is the thickness of the component reduced by the thickness of one N-type region N3, N4. The ordinate indicates the variation in percent of the maximum current IPP for the present invention with respect to the maximum current $IPP_0$ of a conventional component, such as the one of FIG. 1, in which regions N3 and N4 do no overlap. First, it is noted that as ratio r/e increases, current IPP also increases. An increase higher than 10% is obtained for a ratio r/e substantially equal to 0.2. Then, the current IPP decreases while remaining higher than $IPP_0$ up to a value of ratio r/e substantially equal to 0.5. If overlapping is further increased, current IPP becomes lower than current $IPP_0$, that is, the increased overlapping becomes detrimental.

In practice, the thickness of a Shockley diode ranges from 0.2 to 0.35 mm (200–350 μm), that is, for a ratio r/e equal to 0.2, distance r is equal to 40–70 μm. In technologies commonly used for fabricating semiconductor components, these values are far from being negligible since the various masking operations are generally realized with an accuracy of approximately 1–3 μm.

Figure 4:
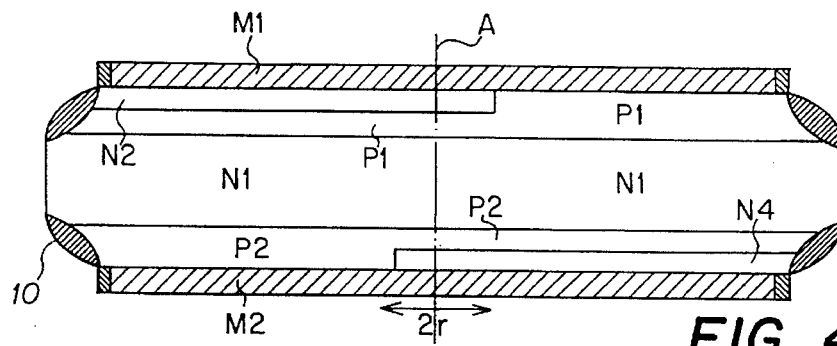
FIG. 4 is a cross-sectional view of a second bidirectional Shockley diode of the mesa-type according to the invention.

FIG. 4 represents a second embodiment of the present invention. In FIG. 4, regions N3 and N4 extend up to the periphery of the component which is, as above, a mesa-type component. FIG. 4 also represents the case when the metallizations M1 and M2 extend up to the periphery of the component. In this case, the implementation of the invention provides similar advantages as those described above.

Figure 5A:
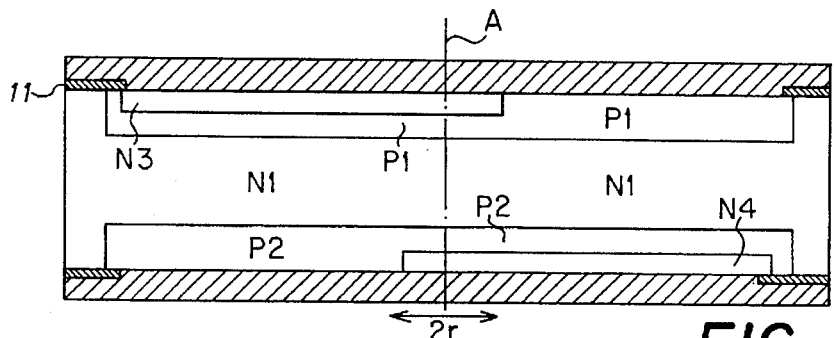
FIG. 5A is a cross-sectional view representing a third bidirectional Shockley diode of the planar-type according to the invention.

FIG. 5A is a third embodiment of a bidirectional Shockley diode of a planar-type according to the present invention. In this case, regions P1 and P2, instead of being layers extending all over the upper and lower surface of the component, are wells that are laterally delineated, and region N1 peripherally extends up to the upper and lower surfaces of the component. N-type regions N3, N4 are formed as discussed above in each region and P2. In this embodiment, the apparent surfaces of the layers are coated with a passivation layer 11, commonly silicon oxide. In this case also, the implementation of the invention provides the same advantages as those described above.

Figure 5B:
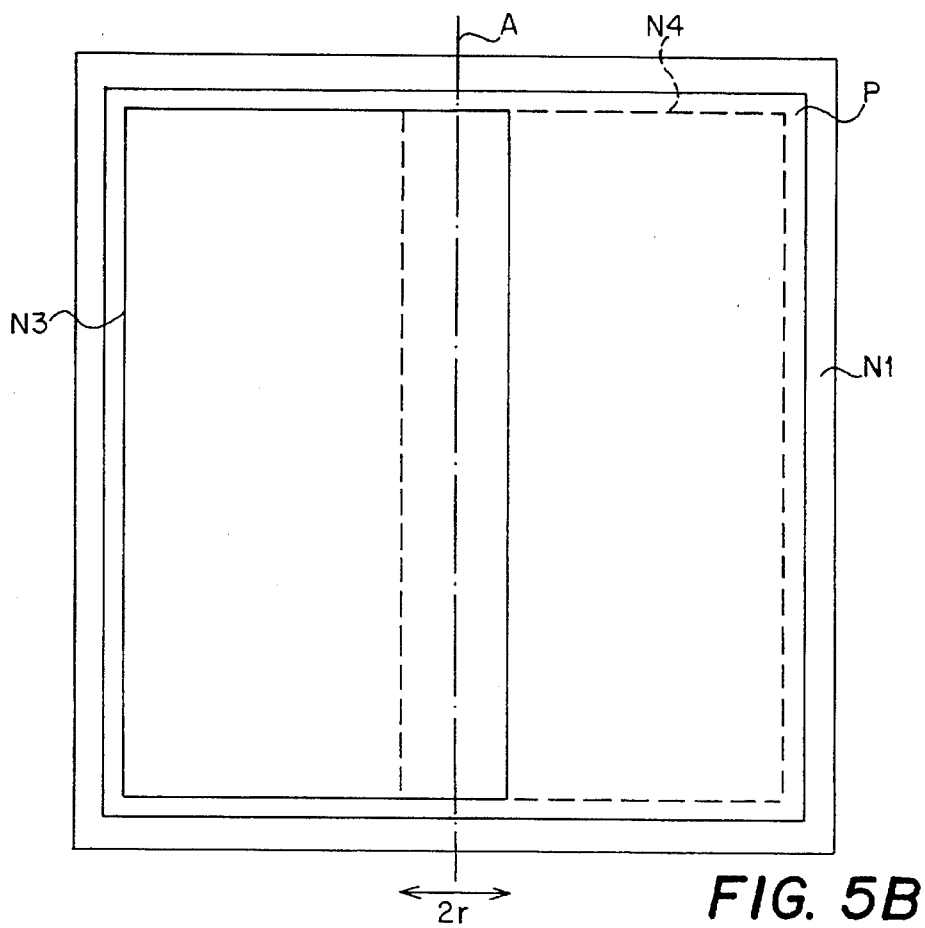
FIG. 5B is a schematic top view corresponding to FIG. 5A.

FIG. 5B is a top view corresponding to the cross-sectional view of FIG. 5A. FIG. 5B shows, at the periphery, the region N1 where the well P1 is formed. Solid lines delineate the boundaries of region N3 and dashed lines delineate the boundaries of region N4. The overlapping 2r between these layers is clearly shown.

Figure 6:
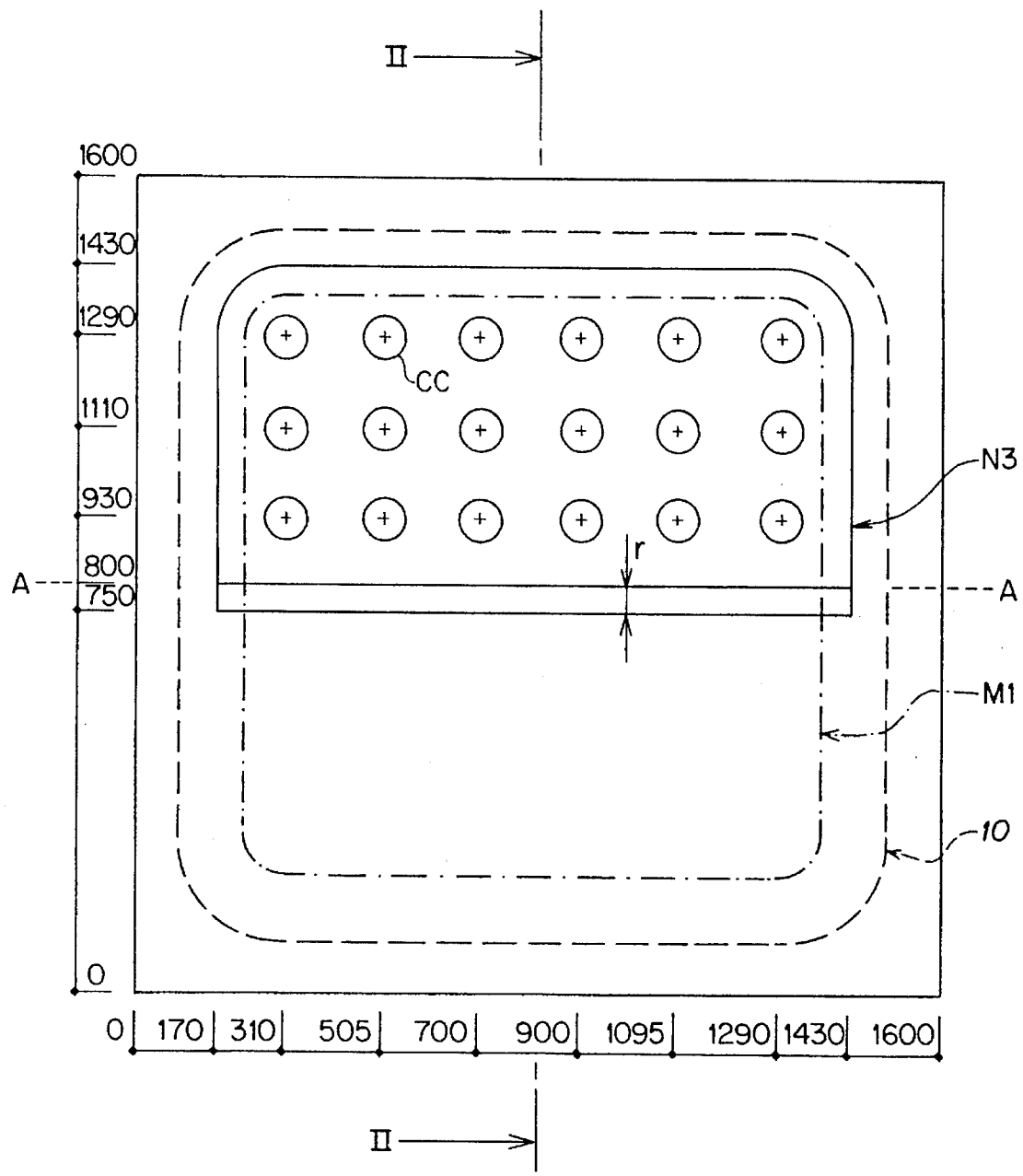
FIG. 6 is a top view, drawn to scale, of a diode according to the invention in the embodiment of FIG. 2.

Practical tests of the present invention have been carried out by using a structure such as the one represented in FIG. 2, a top view of which is represented in FIG. 6. FIG. 2 is a cross-sectional view along the line II—II of FIG. 6. In FIG. 6, reference number 10 indicates the groove edges (with a width of approximately 100 μm), reference M1 indicates the limit of the upper metallization, and reference N3 indicates the outline of the emitter region overlapping the median plane A by approximately 50 μm. It will be noted that the region N3 is interrupted in areas CC that conventionally constitute emitter shorts (in this case, 18 holes of 90 μm in diameter).

The components had characteristics chosen in the following ranges:

| | |
|---|---|
| thickness | 270 μm |
| size | $1.6 \times 1.6$ mm$^2$ |
| doping level of layer N1 | $1.5 \times 10^{15}$–$10^{17}$ at/cm$^3$ |
| doping level of P1 and P2 | $C_s = 5 \times 10^{17}$–$5 \times 10^{18}$ at/cm$^3$ |
| junction depth | $x_p = 25$–$45$ μm |
| doping level of N3 and N4 | $C_s = 10^{19}$ at/cm$^3$ |
| junction depth | $x_p = 15$–$25$ μm |
| breakdown voltage | 60–320 V |

($C_s$ being the surface doping level)

With a conventional component, identical to the component of FIGS. 2 and 6 but in which r=0, one obtains a value $IPP_0$=67 A, and for a component of the type of FIG. 6 in which ratio r/e is substantially equal to 0.2, a value IPP=75 A is obtained.

In this example, it should be noted that the overlapping length r with respect to the median plane (50 μm) corresponds to at least 10% of the width of region N3 up to the median plane (0.65 mm).

Moreover, the invention applies also to a structure where all the conductivity types would be reversed, that is, the structure would be realized from a P-type substrate.

Having thus described one particular embodiment of the invention, various alterations, modifications, and improvements will readily occur to those skilled in the art. Such alterations, modifications, and improvements are intended to be part of this disclosure, and are intended to be within the spirit and scope of the invention. Accordingly, the foregoing description is by way of example only and is not intended to be limiting. The invention is limited only as defined in the following claims and the equivalents thereto.

What is claimed is:

1. A method for forming a protection component comprising the steps of:

forming a first layer of a second conductivity type in an entire upper surface of a substrate of a first conductivity type of said component;

forming a second layer of said second conductivity type in an entire lower surface of said substrate of said component;

forming a third layer of said first conductivity type in a portion of an upper surface of said first layer; and forming a fourth layer of said first conductivity type in a portion of a lower surface of said second layer;

wherein said third and fourth layers extend over substantially complementary halves of said component and each overlap a distance r with respect to a median plane of said component wherein the distance r is less than 0.5e, wherein e is the thickness of the component.

2. The method of claim 1, wherein said distance r is substantially 0.2e, wherein e is the thickness of the component.

\* \* \* \* \*